United States Patent
Baillin

(10) Patent No.: US 8,956,958 B2
(45) Date of Patent: Feb. 17, 2015

(54) METHOD FOR THE PRODUCTION OF A SUBSTRATE COMPRISING EMBEDDED LAYERS OF GETTER MATERIAL

(75) Inventor: Xavier Baillin, Crolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/883,480

(22) PCT Filed: Oct. 31, 2011

(86) PCT No.: PCT/EP2011/069080
§ 371 (c)(1),
(2), (4) Date: May 3, 2013

(87) PCT Pub. No.: WO2012/062613
PCT Pub. Date: May 18, 2012

(65) Prior Publication Data
US 2013/0221497 A1    Aug. 29, 2013

(30) Foreign Application Priority Data
Nov. 9, 2010    (FR) ...................................... 10 59246

(51) Int. Cl.
*H01L 21/332* (2006.01)
*H01L 23/58* (2006.01)
(Continued)

(52) U.S. Cl.
CPC ........ *H01L 21/3221* (2013.01); *B81C 1/00285* (2013.01); *H01L 21/50* (2013.01);
(Continued)

(58) Field of Classification Search
CPC ...................................................... H01L 23/26

USPC ........................................... 438/476; 257/629
See application file for complete search history.

(56) References Cited

U.S. PATENT DOCUMENTS

| 6,890,838 B2 * | 5/2005 | Henley et al. ................. 438/475 |
| 6,897,551 B2 | 5/2005 | Amiotti |

(Continued)

FOREIGN PATENT DOCUMENTS

| EP | 1 640 327 | 3/2006 |
| EP | 2 308 797 | 4/2011 |

(Continued)

OTHER PUBLICATIONS

International Seach Report Issued Mar. 14, 2012 in PCT/EP11/069080 filed Oct. 31, 2011.

(Continued)

*Primary Examiner* — Lex Malsawma
(74) *Attorney, Agent, or Firm* — Oblon, Spivak, McClelland, Maier & Neustadt, L.L.P.

(57) ABSTRACT

A method for producing a substrate with buried layers of getter material, including: making a first stack including one layer of a first getter material, arranged on a first support; making a second stack including one layer of a second getter material, arranged on a second support; and bringing the first stack into contact with the second stack and performing thermocompression, the layers of the first and of the second getter material being arranged between the first and the second support, at a temperature greater than or equal to a lowest temperature among thermal activation temperatures of the first and of the second getter material, to bond the layers of the first and second getter materials together.

23 Claims, 7 Drawing Sheets

(51) Int. Cl.
  *H01L 21/322* (2006.01)
  *B81C 1/00* (2006.01)
  *H01L 21/50* (2006.01)
  *H01L 23/10* (2006.01)
  *H01L 23/26* (2006.01)

(52) U.S. Cl.
  CPC ............... *H01L 23/10* (2013.01); *H01L 23/26* (2013.01); *B81C 2201/019* (2013.01); *B81C 2203/0118* (2013.01); *B81C 2203/036* (2013.01); *H01L 2924/0002* (2013.01)
  USPC .......................................... 438/476; 257/629

(56) References Cited

U.S. PATENT DOCUMENTS

| | | | |
|---|---|---|---|
| 7,202,124 B2* | 4/2007 | Fitzgerald et al. | 438/200 |
| 2004/0048449 A1 | 3/2004 | Amiotti | |
| 2004/0080261 A1* | 4/2004 | Yokota et al. | 313/495 |
| 2004/0229443 A1* | 11/2004 | Bower | 438/455 |
| 2005/0253283 A1* | 11/2005 | DCamp et al. | 257/787 |
| 2006/0033433 A1* | 2/2006 | Carr | 313/546 |
| 2006/0076634 A1 | 4/2006 | Palmateer et al. | |
| 2006/0283546 A1 | 12/2006 | Tremel et al. | |
| 2007/0210431 A1 | 9/2007 | Amiottis | |
| 2007/0262428 A1 | 11/2007 | Summers | |
| 2008/0038861 A1 | 2/2008 | Amiotti | |
| 2009/0053855 A1 | 2/2009 | Summers | |
| 2009/0189230 A1 | 7/2009 | Palmateer et al. | |
| 2010/0003789 A1 | 1/2010 | Caplet et al. | |
| 2010/0178419 A1 | 7/2010 | Baillin | |
| 2010/0193215 A1 | 8/2010 | Baillin | |
| 2011/0079425 A1 | 4/2011 | Baillin et al. | |
| 2011/0079889 A1 | 4/2011 | Baillin | |
| 2011/0290552 A1 | 12/2011 | Palmateer et al. | |

FOREIGN PATENT DOCUMENTS

| | | |
|---|---|---|
| FR | 2 922 202 | 4/2009 |
| FR | 2 933 390 | 1/2010 |
| WO | WO 2009/087284 A1 | 7/2009 |

OTHER PUBLICATIONS

Preliminary Search Report issued Jul. 18, 2011 in French Application No. 1059246 (With English Translation of Category of Cited Documents).

* cited by examiner

METHOD FOR THE PRODUCTION OF A SUBSTRATE COMPRISING EMBEDDED LAYERS OF GETTER MATERIAL

TECHNICAL FIELD

The invention relates to the field of getter materials used to absorb and/or adsorb gases in a closed environment. The invention relates particularly to a method for producing a substrate with buried, or embedded, layers of getter materials, in other words located between other layers of the substrate.

The invention is also applicable for producing micro-devices comprising one or several micro-systems, for example of the MEMS (micro electromechanical systems) and/or NEMS (nano electromechanical systems) or infrared detector type such as micro-bolometers, made on a substrate with buried layers of getter materials and intended to be encapsulated.

STATE OF PRIOR ART

Some micro-systems such as MEMS and/or NEMS type micro-systems, and infrared micro-detectors have to be enclosed in a cavity with a controlled atmosphere (nature of gas, pressure) to enable their satisfactory operation.

The technology used at the moment to make such encapsulation consists of making these micro-systems collectively on a silicon wafer referred to herein as the first substrate. The cavity in which each of the micro-systems is intended to be encapsulated is obtained by transfer and hermetic sealing of a cover, usually formed by another silicon wafer called the second substrate, onto the first substrate. This hermetic assembly made between the two substrates and forming micro-system encapsulation cavities is particularly useful for controlling gas leaks between the inside of the cavities and the outside environment. The addition of non-evaporable getters (NEG) in the cavities, for example in the form of a thin portion previously deposited on one of the two substrates, provides a means of controlling the atmosphere (gas and pressure) inside the cavities.

Making a cavity under controlled atmosphere in which a micro-system is encapsulated therefore requires the use of a getter deposit on one of the two substrates prior to the assembly operation, as described in document US 2003/052392 A1. In this document, the getter material is present in the cavity through a window exposing part of this getter. However, a high vacuum cannot be achieved in the cavity with this solution. Furthermore, the getter material is subjected to all technological steps from manufacturing of the micro-system until encapsulation and closing of the cavity, which can deteriorate it and reduce its gas pumping capacity.

More generally, making the getter requires the use of technological deposition and etching operations in order to shape the getter in two dimensions. One variant may consist of depositing the getter directly in the form required by stencil, through a hard mask or a film of photosensitive resin (lift-off). In all cases, these steps introduce a high cost in making the encapsulation. These steps also introduce a risk for the getter due to its chemical compatibility with the products used to perform these operations.

PRESENTATION OF THE INVENTION

One purpose of this invention is to propose a new type of substrate from which a device or micro-device such as a micro-system can be made and encapsulated in a cavity comprising at least one getter material not requiring the use of specific steps related to shaping of the getter, with better gas pumping capabilities and not requiring the implementation of steps that could deteriorate the getter.

To achieve this, this invention discloses a method for producing a substrate with buried layers of getter material comprising at least the following steps:

making a first stack comprising at least one layer of a first getter material arranged on a first support, making a second stack comprising at least one layer of a second getter material arranged on a second support, bringing the first stack into contact with the second stack and performing thermocompression, the layers of the first and second getter material being arranged between the first and the second support, at a temperature greater than or equal to the lowest temperature among the thermal activation temperatures of the first and the second getter materials, so as to bond the layers of the first and second getter materials together.

The substrate thus obtained can overcome problems related to shaping of getter materials considering that this getter material is already present in the substrate in the form of buried layers.

Such a substrate comprising two layers of getter material has better gas absorption properties than a structure comprising a single layer of getter material.

Furthermore, considering that the getter material(s) is (are) present in the substrate in the form of buried layers, it (they) is (are) also protected during subsequent technological operations, for example during production of a device such as a micro-system on this substrate, preventing deterioration of the getter material.

When there is no protective layer covering the layers of getter material, bonding by thermocompression can also eliminate any native oxide and/or nitride layers covering the getter materials.

The <<thermal activation temperature>> of a getter material refers to the temperature above which this getter material has gas absorption and/or adsorption properties when it is exposed to this temperature.

The thermocompression step is preferably done at a pressure of a few MPa, and for example more than 1 MPa.

The first stack may also comprise a protective layer of the first getter material arranged on the layer of the first getter material, and/or the second stack may also comprise a protective layer of the second getter material arranged on the layer of the second getter material, and the step bringing the layers into contact and performing thermocompression may make the protective layer(s) diffuse with the layer(s) of getter material on which the protective layers are arranged.

This diffusion takes place either from the protective layer to the layer of getter material, or conversely from the layer of getter material to the diffusion layer.

Due to the protective layer(s) formed on one of or on both layers of getter material, the absorption and/or adsorption capacity of the layer(s) of getter material is not modified during production of the substrate.

When at least one of the layers of getter material is covered by a protective layer, the thermal activation temperature of the protected layer of getter material may then correspond to the temperature at which this protective layer diffuses with the layer of getter material.

The getter materials of the first and second layers may be identical or different.

The protective layer of the first getter material and/or the protective layer of the second getter material may comprise oxide and/or nitride, for example oxide and/or nitride of the first and/or the second getter material.

The protective layer of the first getter material and/or the protective layer of the second getter material may be made by oxidation and/or nitridation of the layer of the first getter material and/or the layer of the second getter material under a dry atmosphere of dioxygen and/or dinitrogen.

The first support and/or the second support may comprise at least a semiconductor.

The first getter material and/or the second getter material may comprise titanium and/or zirconium and/or vanadium and/or niobium and/or tantalum.

The contact creation and thermocompression step between the first stack and the second stack may be applied under a secondary vacuum.

The method may also comprise a thinning and/or polishing step of the first support and/or the second support, after the step to create contact and thermocompression.

The first stack may also comprise a first dielectric layer and/or a bond layer comprising titanium and/or zirconium, arranged between the first support and the layer of the first getter material, and/or the second stack may also comprise a second dielectric layer and/or a bond layer comprising titanium and/or zirconium, arranged between the second support and the layer of the second getter material.

The first and/or the second stack may also comprise at least one copper and/or nickel and/or platinum and/or silver and/or ruthenium and/or chromium and/or gold and/or aluminium layer arranged between the first support and the layer of the first getter material and/or between the second support and the layer of the second getter material.

The method may also comprise a step to degas the faces of said stacks that are to be brought into contact with each other, after the first and the second stack have been produced and before the contact creation and thermocompression step.

When the first and/or the second stack does not comprise a protective layer, it is possible that an oxide layer forms on the surface of the first and/or the second getter material if this or these getter materials are exposed to air. In this case, a heat treatment step can be applied to dissolve this oxide layer before the contact creation and thermocompression step.

The method may also comprise a thinning and/or polishing step of the layer of the first getter material and/or of the layer of the second getter material during the making of the first stack and/or the second stack (for example implemented before the protective layer(s) is (are) made), and/or when the first and/or second stack comprise(s) the protective layer of the first getter material and/or the protective layer of the second getter material, a step of hydrophilic treatment of the protective layer of the first getter material and/or the protective layer of the second getter material. Such a hydrophilic treatment improves the assembly made between the two stacks.

The invention also relates to a method for making a device comprising at least the following steps:
implement a method to make a first substrate as described above,
making a micro-device, for example a micro-system, on the first substrate or on a second substrate,
etching part of the first substrate, exposing part of the layer of the first getter material
and/or part of the layer of the second getter material, and also comprising a step to encapsulate the micro-device or micro-system in a cavity formed between the first substrate and a cover bonded to the first substrate when the micro-device or micro-system is made on the first substrate, or a step to encapsulate the micro-device or micro-system in a cavity formed between the second substrate and the first substrate bonded to the second substrate when the micro-device or micro-system is made on the second substrate, said part of the layer of the first getter material and/or said part of the layer of the second getter material being arranged in the cavity.

When the method for producing the first substrate comprises a thinning and/or polishing step of the second support, the micro-device or micro-system may be made in and/or on the second thinned and/or polished support.

In a first variant, the cover may comprise a thin layer of material.

In a second variant, the cover may comprise a substrate obtained by implementing a method for producing a substrate as described above.

The invention also relates to a substrate with buried layers of getter material, comprising at least:
a first stack comprising at least one layer of a first getter material, arranged on a first support,
a second stack comprising at least one layer of a second getter material arranged on a second support,
the layers of the first and second getter material being bonded to each other and arranged between the first support and the second support.

The layers of the first and the second getter material form the buried layers of getter material between the first support and the second support. Thus, the substrate obtained comprises layers of the first and second getter material completely buried between the first support and the second support.

The layers of the first and the second getter material may be thermocompressed in contact with each other.

The layer of the first getter material and/or the layer of the second getter material may also comprise dissolved particles of oxygen and/or nitrogen.

The invention also relates to a device comprising at least one micro-system made on a first substrate like that described above or on a second substrate and encapsulated either in a cavity formed between the first substrate and a cover bonded to the first substrate when the micro-device or micro-system is made on the first substrate, or in a cavity formed between the second substrate and the first substrate bonded to the second substrate when the micro-device or micro-system is made on the second substrate, exposed part of the layer of the first getter material and/or exposed part of the layer of the second getter material being arranged in the cavity.

The cover may comprise a thin layer of material or a substrate like that described above.

BRIEF DESCRIPTION OF THE DRAWINGS

This invention will be better understood after reading the description of example embodiments given purely for information and in no way limitative, with reference to the appended drawings on which.

Identical, similar or equivalent parts of the different figures described below are marked with the same numeric references to facilitate comparison between different figures.

The different parts shown in the figures are not necessarily all at the same scale, to make figures more easily readable.

The various possibilities (variants and embodiments) must be understood as not being exclusive of each other and may be combined with each other.

DETAILED PRESENTATION OF PARTICULAR EMBODIMENTS

Refer firstly to FIGS. 1A to 1D that show the steps of a method for producing a substrate 100 with buried layers of getter material according to a first embodiment.

Figure 1A:
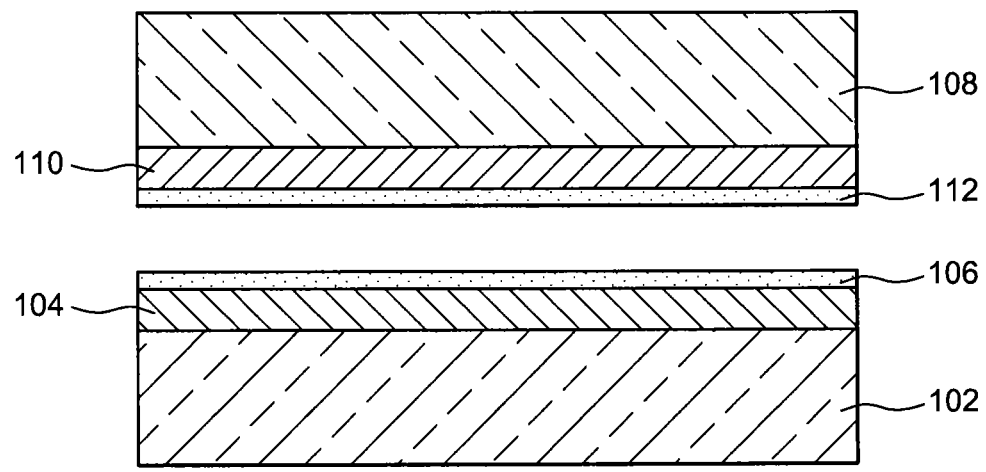
FIGS. 1A to 1D show steps of a method for producing a substrate with buried layers of getter material according to a first embodiment.

As shown in FIG. 1A, the first step is to make a first layer 104 comprising a getter material, on a first support 102 for example comprising a substrate comprising a semi-conductor such as silicon. This getter material may be any metallic material that may have gaseous absorption and/or adsorption properties after thermal activation, for example titanium and/or zirconium and/or vanadium and/or niobium and/or tantalum and/or an alloy of several of these metals.

Such a layer 104 of getter material may for example be made by a PVD (Physical Vapour Deposition) type deposition, sputtering or evaporation, over the entire surface of the first support 102 (full-wafer deposit). In this case, the thickness of the layer of getter material 104 is between 100 nm and 2 μm.

The getter layer 104 is then covered by a protective layer 106 preventing the getter material of layer 104 from being exposed to ambient air and absorbing gases in the ambient air (oxygen, nitrogen, carbon monoxide and dioxide) and water vapour present in the ambient air. This protective layer 106 may for example comprise oxide and/or nitride of the getter material of the layer 104.

Such a protective layer 106 may for example be obtained by oxidation and/or nitridation of the getter material, performed under a dry atmosphere of dioxygen and/or dinitrogen. <<Dry atmosphere of dioxygen and/or dinitrogen>> means an atmosphere with a low or zero partial pressure of water vapour (for example less than about $10^{-5}$ mbars). Unlike oxidation of the getter material that occurs when the getter material is exposed to ambient air, dry oxidation and/or nitridation, in other words in a closed environment containing dry oxygen and/or dry dinitrogen, does not diffuse hydrogen molecules in the getter material. Thus, no degassing is necessary to specifically eliminate these hydrogen molecules.

The protective layer 106 of oxide and/or nitride can reversibly absorb and/or adsorb gaseous molecules, for example molecules in ambient air, thus protecting the entire surface of the getter material 104 from any alteration by these gas molecules during production of the substrate 100. Therefore such a protective layer 106 can increase the pumping capacity of the getter material compared with an unprotected getter material exposed to ambient air. Furthermore, the getter material 104 thus protected may be thermally activated with a lower thermal activation temperature, for example about 20° C. to 30° C. less than the activation temperature of an unprotected getter material with a similar nature and exposed to ambient air.

When the protective layer 106 comprises oxide, the oxidation step may be carried out at a pressure more than about $10^{-2}$ mbars and/or at a temperature more than or equal to about 50° C. and/or for a duration between about 1 min and 10 min, particularly when the getter material 104 comprises titanium and/or zirconium. These parameters correspond to the fact that the oxidation rate of titanium remains the same within this temperature range.

Furthermore, the surface may appear saturated in adsorbed species starting from about $10^{-2}$ mbars for an exposure time of about one minute. Thus, by choosing a temperature greater than or equal to about 50° C., for example about 100° C., a sufficiently thick protective layer 106 is formed to absorb and/or adsorb gas molecules to which the getter material may be exposed. The protective layer 106 thus formed may be between about one and a few nanometers thick, for example between about 1 nm and 10 nm.

When the protective layer 106 comprises nitride, the nitridation step may be done with parameters similar to those indicated above for oxidation, and preferably at a temperature between about 100° C. and 120° C., and/or for a duration of between about 1 min and 10 min and/or a pressure greater than or equal to about $10^{-2}$ mbars, particularly when the getter material comprises titanium and/or zirconium.

The parameters given above may also be applicable for getter materials other than titanium or zirconium.

It is also possible that the protective layer 106 comprises a material other than an oxide or a nitride. Thus, when the getter layer 104 comprises for example titanium or zirconium, the protective layer may comprise chromium and it may be several tens of nanometers thick, for example between about 10 nm and 100 nm. In this case, the getter thus protected will diffuse in the chromium during the subsequent thermocompression step so as to be present on the surface.

At the same time as the layers 104 and 106 are made on the first support 102, a second layer 110 of getter material itself covered by a second protective layer 112 is made on a second support 108 formed in this case by a substrate similar to the support 102. The getter materials of the layers 104 and 110 may or may not be similar. When producing the layers 104 and 110 from different getter materials, it is thus possible to have two different thermal activation temperatures. Thus, the getter may be activated twice, which can give a greater pumping capacity. The two getter layers can be assembled such that the getter material with the lowest thermal activation temperature is intended to be exposed to the atmosphere in the cavity, and the other getter material (with a higher thermal activation temperature) is located under the lower temperature getter. Thus, the lower temperature getter may be <<regenerated>> during thermal activation of the getter with a higher activation temperature.

Furthermore, the second protective layer 112 may comprise oxide and/or nitride of the getter material of the getter material of the second getter layer 110.

A cleaning operation of the getter layers 104, 110 can be performed before the protective layers 106 and 112 are made, for example by ion bombardment of a rare gas and/or pre-activation of getter layers 104, 110 under a vacuum.

Figure 1B:
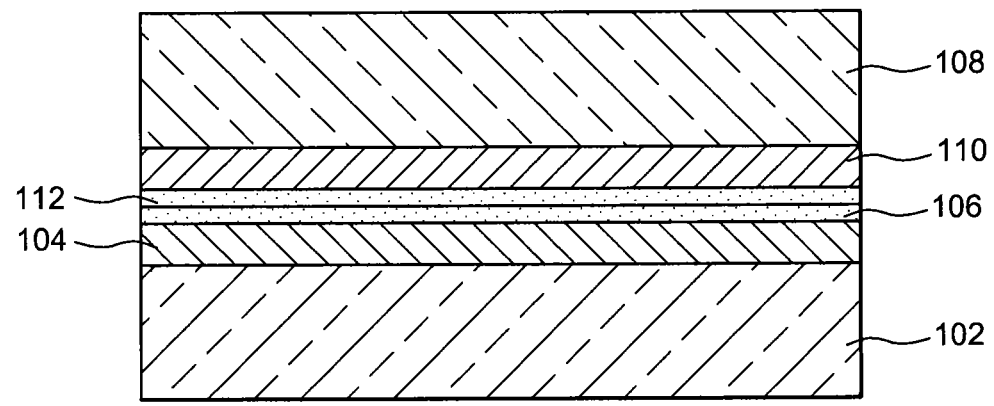
Figure 1C:
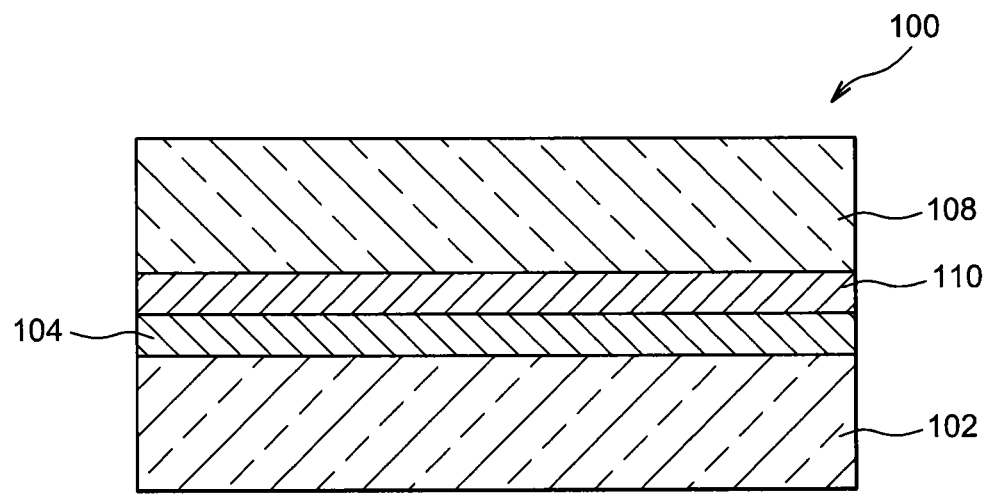

As shown in FIG. 1B, the protective layers 106 and 112 are then brought into contact with each other. The protective layers 106 and 112 are compressed against each other and a heat treatment (thermocompression) is applied to them until these protective layers 106 and 112 are eliminated and a metal/metal bond between the layers of getter materials 104 and 110 obtained by interdiffusion between the getter materials 104 and 110 bonds the getter layers 104, 110 to each other (FIG. 1C). Considering the high solubility of oxygen and nitrogen in particular, in the getter, oxides and nitrides are dissolved within the range of getter material temperatures, along metal grain boundaries. Therefore, after this thermocompression has been applied, the getter materials 104 and 110 comprise dissolved particles of oxygen and/or nitrogen. When one or both protective layers 106, 112 comprise chromium, the diffusion phenomenon of the getter layer towards chromium corresponds to a surface segregation phenomenon that causes metal/metal bonding on the surface. This bonding between the getter layers 104 and 110 is made under a controlled vacuum (secondary vacuum), in other words at a pressure of between about $10^{-4}$ mbars and $10^{-6}$ mbars, so that the pumping capacity of the getters 104, 110 can be maintained and there can be good hermeticity and good mechanical strength between the two supports 102, 108.

No oxide layer is formed on the surface of the getter layers 104 and 110, since the layers of getter material 104 and 110 are initially protected by the protective layers 106 and 112.

When the getter layers 104 and 110 come into contact with each other after the elimination of the protective layers 106 and 112, a metal/metal contact is thus obtained. This mechanical bond formed between the getter layers 104 and 110 is achieved by the low roughness of the getter layers 104 and 110. At the present time, this low roughness is achieved due to the deposition method used (PVD) to form the getter layers 104 and 110 on the substrates 102 and 108, and due to the thinness of these getter layers 104 and 110.

Before the protective layers 106 and 112 are made, the getter layers 104 and 110 may be subjected to a chemical-mechanical polishing (CMP) operation to reduce the roughness of the layers 104 and 110. Such an operation may be done for getter layers with a large thickness, for example greater than or equal to about 1 μm. This polishing operation may be followed by a step to clean the layers of getter material, particularly to remove hydrogen that can be brought in by liquids used during polishing, by a temperature treatment under secondary vacuum. Another dry oxidation or nitridation operation is advantageously done after such a step. Furthermore, when the getter layer(s) is (are) thin, for example equal to or less than about 100 nm, the roughness of such layers is generally relatively low and no polishing operation is necessary.

A treatment may also be done to make the surfaces of the protective layers 106 and 112 hydrophilic so as to make a pre-assembly of the getter layers 106, 112 by Van der Waals forces, as in a Silicon Direct Bonding (SDB) method, and thus a preliminary bonding step between the protective layers 106 and 112 may be done before the temperature mechanical consolidation. Such a hydrophilic treatment can be done using wet and/or dry methods (oxygen or nitrogen plasma) like those used for a silicon/silicon molecular bonded assembly.

When the protective layers 106 and 112 have been exposed to ambient air before being brought into contact with each other, temperature degassing of these layers 106, 112 can be done before they are put into contact with each other. This degassing may be done by a heat treatment, for example at a temperature about 50° C. to 150° C. lower than the lowest thermal activation temperature among the thermal activation temperatures of the getter materials 104 and 110, and under a secondary vacuum. Such a heat treatment can desorb gas molecules that have been adsorbed and/or absorbed by the protective layers 106 and 112, without activating the getter materials during this degassing phase.

This degassing step may be applied for a duration of between about a few minutes and a few tens of minutes, for example between about 2 min and 50 min.

Figure 1D:
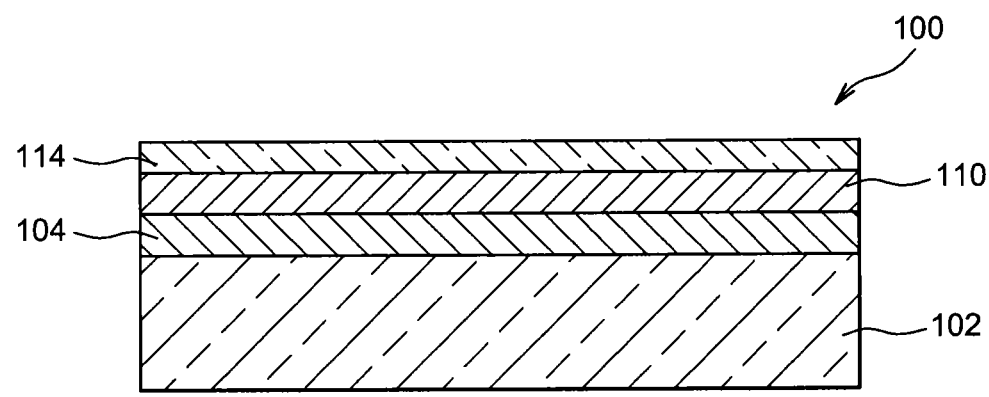

After the getter layers 104, 110 have been bonded to each other, a mechanical thinning operation can be done followed by a CMP polishing operation of one of the two supports, for example the second support 108, so that a remaining part of this second support 108 forms a layer 114 with a thickness chosen as a function of the subsequent use of the substrate 100 (FIG. 1D). For example, this thickness may be between a few micrometers and about 100 μm. For example, this layer 114 may be used for the subsequent production of MEMS microsystems comprising elements formed by etching in the layer 114. The result achieved is thus a substrate 100 for which the geometry is fairly similar to the geometry of an SOI (Silicon On Insulator) substrate, except that in this case the buried dielectric is replaced by two buried getter layers.

Figure 2A:
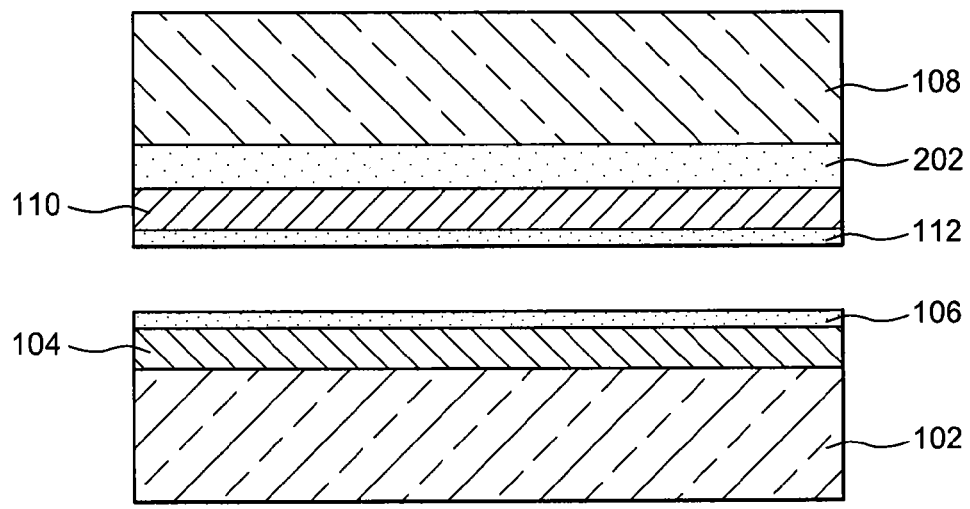
FIGS. 2A and 2B show steps of a method for producing a substrate with buried layers of getter material according to a second embodiment.
Figure 2B:
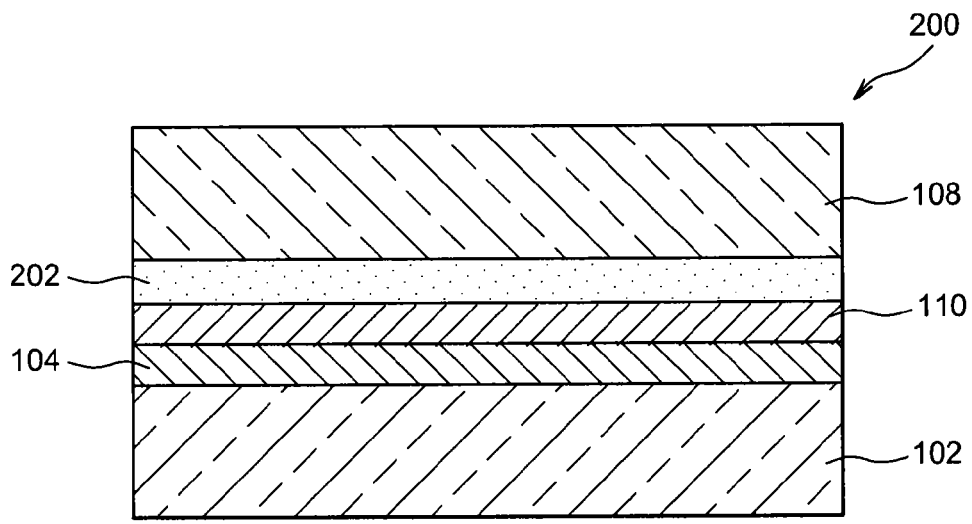

Refer to FIGS. 2A and 2B that show the steps of a method to make a substrate 200 with buried layers of getter materials according to a second embodiment.

As for the previously described substrate 100, the first step is a full-wafer deposit of the getter layer 104 on the first support 102. The protective layer 106 comprising oxide and/or nitride is then formed on the getter layer 104.

The second support 108 is covered by a dielectric layer 202 comprising oxide and/or nitride. When the support 108 comprises a semiconductor such as silicon, this layer 202 is formed for example by oxidation (oxidation in oxidizing ambiance or by a CVD type oxide deposit) and/or nitridation of the second support 108. The thickness of the dielectric layer 202 is greater than the thickness of the protective layer 106 and for example is between about 10 nm and 10 μm. This dielectric layer 202 is then covered by the layer of getter material 110 and by the protective layer 112.

The protective layers 106 and 112 are then brought into contact with each other. Thermocompression is then applied between these two layers, in a manner similar to the first embodiment. This thermocompression eliminates the protective layers 106 and 112 and forms a mechanical bond between the getter layers 104 and 110.

Thus, the result achieved is a SOIAG (Silicon On Isolator And Getter) type substrate 200 comprising two buried getter layers 104, 110, and a dielectric layer 202 arranged between these getter layers 104, 110 and the support 108 (which can then be thinned as described above for the substrate 100), particularly creating electrical insulation between the support 108 and the getter layers 104, 110. In one variant, the dielectric layer 202 may be arranged between the first support 102 and the getter layer 104. The dielectric layer 202 may advantageously act as a stop layer for etching of the support 108, when making a resonant micro-device by etching the support 108. A moving part of the micro-device can thus be released by final etching of the dielectric layer 202 and stopping on the getter layer 110.

Figure 3A:
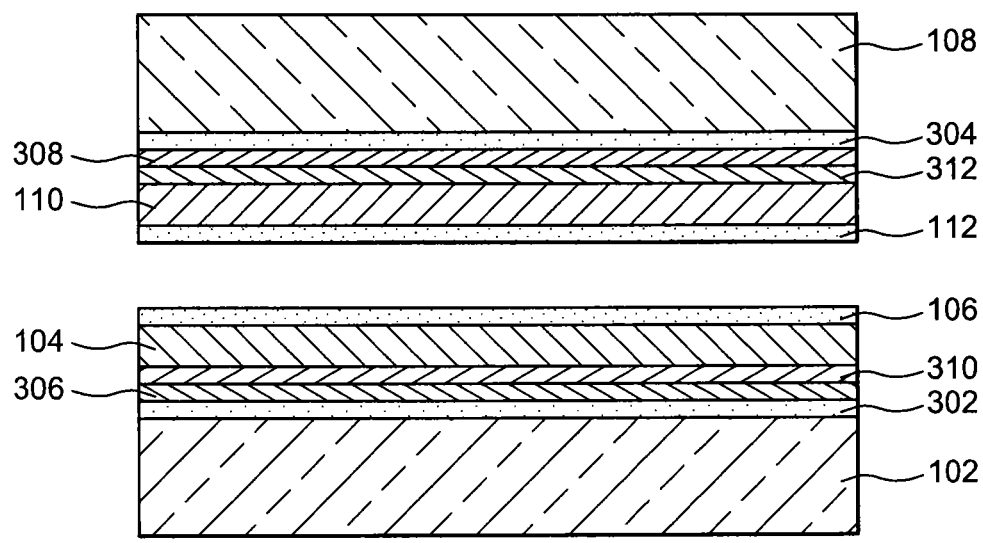
FIGS. 3A and 3B show steps of a method for producing a substrate with buried layers of getter material according to a third embodiment.
Figure 3B:
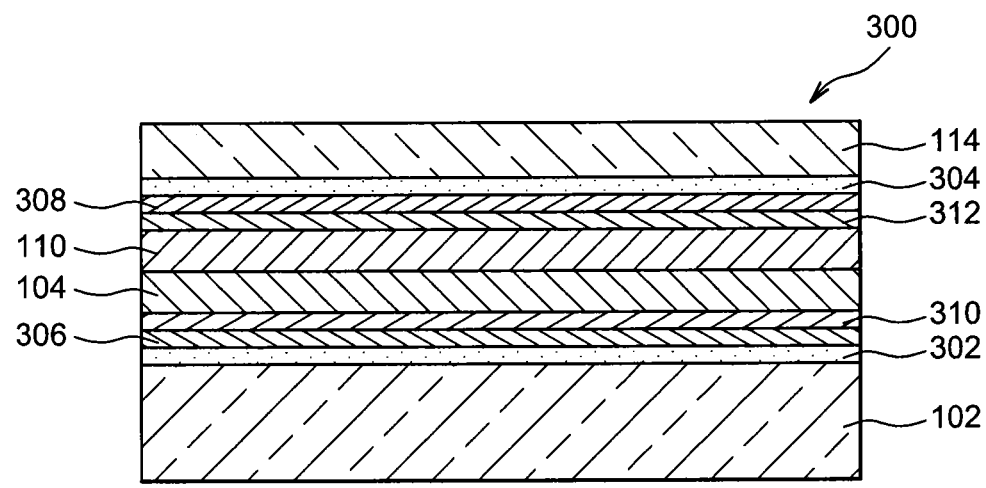

Refer to FIGS. 3A and 3B that show the steps of a method for producing a substrate 300 with buried getter layers according to a third embodiment.

As for the previously described substrates 100 and 200, the substrate 300 is formed from two supports 102 and 108, formed by silicon substrates. However, unlike substrates 100 and 200, the getter layers 104 and 110 are not deposited directly on the supports 102 and 108. Dielectric layers 302 and 304 are firstly formed on the supports 102 and 108.

These dielectric layers 302 and 304 may comprise oxide and/or nitride, and may be formed by oxidation and/or nitridation of supports 102, 108. These dielectric layers 302 and 304 may for example be between a few tens of nanometers and a few micrometers thick.

Bond layers 306 and 308 are then made on the dielectric layers 302 and 304 respectively. The bond layers 306, 308 may for example be formed by deposition, and may for example be between about 20 nm and 100 nm thick and may comprise for example titanium or zirconium. These bond layers 306, 308 can improve the bond between the dielectric layers 302 and 304 and the layers 310 and 312 intended to be made on the bond layers 306, 308.

The layers 310 and 312 formed on the bond layers 306, 308 are intended to be used to modulate the thermal activation temperature of the layers of getter material 104 and 110 that will be formed on these layers 310, 312, in other words to modulate the temperature at which these getter layers 104, 110 are intended to react with the atmosphere present inside the cavity in which these getter materials are intended to be encapsulated. For example, the layers 310 and 312 comprise copper and/or nickel and/or platinum and/or silver and/or ruthenium and/or chromium and/or gold and/or aluminium and the thickness may be between about 50 nm and 500 nm when the thickness of the getter layers 104, 110 is between about 100 nm and 2000 nm, or between about 10 nm and 100 nm when the thickness of the getter layers 104, 110 is between about 100 nm and 900 nm. These adjustment sub-layers 310, 312 may have mechanical properties (elasticity/plasticity) that will facilitate subsequent contact between the two getter layers 104 and 110. Other details and variant embodiments of such thermal activation temperature adjustment layers are described in document WO 2009/087284 A1.

The getter layers 104 and 110 are then deposited on the adjustment layers 310 and 312.

Finally, protective layers 106 and 112, similar to those previously described for producing substrates 100 and 200, are formed on getter layers 104 and 110 (FIG. 3A).

In the same way as for the substrates 100 and 200 described previously, the protective layers 106 and 112 are then brought into contact and thermo-compressed against each other to make the getter layers 104 and 110 bond to each other after the protective layers 106 and 112 have been eliminated.

Finally, the substrate 300 is completed by performing a mechanical thinning operation and then chemical-mechanical polishing of the second support 108, forming a layer 114 with a thickness chosen as a function of the subsequent use of the substrate 300 (FIG. 3B).

For example, it would be possible to make micro-systems on and/or in the thinned layer 114, the dielectric layer 304 being used both as an etch stop layer during etching (for example by machining) of layer 114, and as a release layer (for example by etching it using hydrofluoric acid in vapour form). When the dielectric layer 304 acts as a sacrificial layer to release mobile parts of micro-systems made in layer 114, this dielectric layer 304 may be made so that its thickness is between about 1 μm and 10 μm.

Considering that the layers of getter materials 104 and 110 may or may not comprise the same getter material and that the dielectric layers 302, 304 may comprise oxide or nitride, it can be seen that about ten different variants of the substrate 300 can be made by combining these different variants.

For all previously described embodiments, assembly by thermo-compression under secondary vacuum and under stress is achieved at a temperature higher than or equal to the thermal activation temperature of the getter material with the lowest thermal activation temperature among the getter materials of the layers 104 and 110. The getter material thus activated can reduce the protective layers and/or the native oxide or nitride layers and thus form a metal/metal bond between the getter layers. The maximum assembly temperature may correspond to the thermal activation temperature of the getter with the highest thermal activation temperature. The following table gives examples of thermal activation temperatures of a getter layer comprising titanium with a thickness of between about 100 nm and 2 μm, as a function of the nature of the material of the adjustment sub-layer that is between about 50 nm and 500 nm thick.

| Adjustment sub-layer | Activation temperature |
|---|---|
| Ru | 275° C. |
| Cr | 300° C. |
| Pt | 325° C. |
| Ni | 350° C. |
| Au | 365° C. |
| Cu | 375° C. |
| Ag | 380° C. |
| Al | 400° C. |

The following table gives temperatures for performing the thermo-compression assembly operation for getter layers 104 and 110 comprising titanium, as a function of the nature of the adjustment sub-layers under each of the getter layers, as examples.

| T° activation | Cr | Ni | Cu | Al |
|---|---|---|---|---|
| Cr | 300° C. | 300-350° C. | 300-375° C. | 300-400° C. |
| Ni | 325° C. | 325-350° C. | 325-375° C. | 325-400° C. |
| Cu | | | 350° C. | 375° C. | 350-400° C. |
| Al | | | | 400° C. |

A getter material comprising a thin layer of Ti and/or Zr is activated for example at a temperature of between about 200° C. and 400° C.

The variants described above for producing the substrate 100 (mechanical-chemical thinning operation of the getter layers in order to reduce the roughness of the getter material, a hydrophilic type treatment, degassing of the protective layers 106 and 112, cleaning operation or pre-activation of the getter layers 104, 110 under vacuum) may also be applied for producing substrates 200 and 300.

We will now describe different micro-devices comprising encapsulated micro-systems made from at least one substrate with buried or buried getter layers, with reference to FIGS. 4A to 4H. The substrate(s) with buried getter layers correspond to the previously described substrate 100 in the different examples described.

However, any variant of the substrates 100, 200 or 300 could be used to make these micro-devices.

Figure 4A:
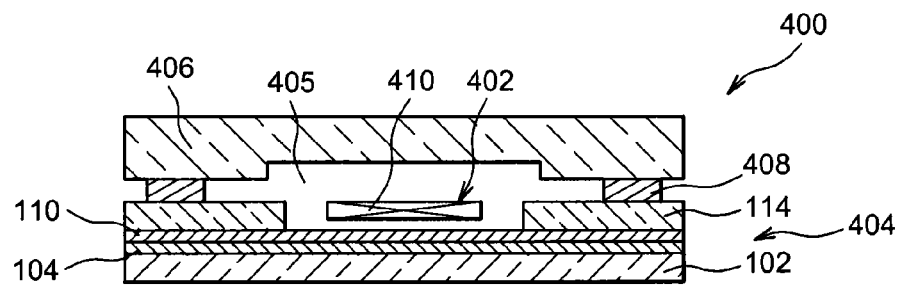
FIGS. 4A to 4H show micro-devices comprising encapsulated micro-systems made using a method according to this invention.

A micro-device 400 shown in FIG. 4A comprises a micro-system 402, for example a MEMS, formed in the silicon layer 114 of a substrate 404 similar to the previously described substrate 100. This micro-system 402 may for example be obtained using photolithography and etching steps of the silicon layer 114. When the micro-system 402 comprises a resonant structure, the final etching step may be deep reactive ion etching (DRIE) in the silicon layer 114, forming a moving mass of the resonant structure. When the substrate 404 is similar to the substrate 200 or 300, or more generally when the substrate 404 comprises one or several layers of materials arranged between the getter layers 104, 110 and the silicon layer 114, elements of the micro-system 402 may be released by performing several etching steps to selectively etch the different layers present under the getter layer. Therefore the dielectric layers of substrates 200 and 300 described above can be used as etching stop layers during production of micro-systems in these substrates.

The micro-system 402 is encapsulated in a cavity 405 formed between the substrate 404 and a cover 406 bonded to portions of the silicon layer 114 by a sealing bead 408. The cover 406 may for example be formed by a semiconductor substrate.

The transfer operation of the cover 406 may be made by hermetic sealing under a controlled atmosphere such that this controlled atmosphere is located in the cavity 405. As shown in FIG. 4A, the micro-system 402 comprises etched portions of the layer 114 for example forming one or several moving parts 410 of the micro-system 402.

The etched parts of the layer 114 expose portions of the getter layer 110 in the cavity 405 so that the atmosphere in the cavity 405 can be controlled. The getter may be activated during sealing of the cover 406 and/or after this sealing by an appropriate heat treatment.

Figure 4B:
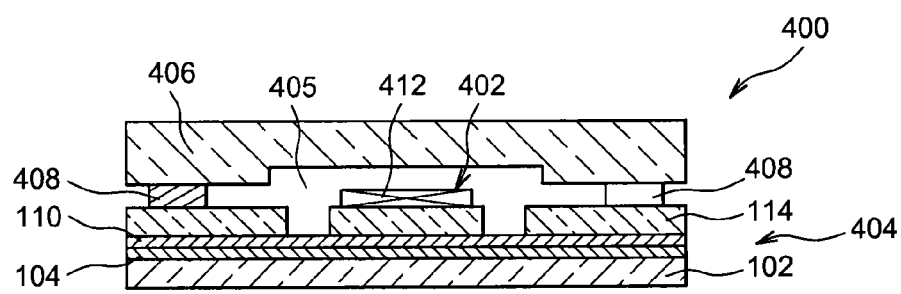

In one variant embodiment shown in FIG. 4B, the micro-system 402 is made on the layer 114, for example from one or several layers of materials deposited on the layer 114 before the cover 406 is bonded to the substrate 404. Therefore, remaining portions 412 of this or these layers of materials forming the micro-system 402 are located on portions of the layer 114. However, some parts of the layer 114 are etched to expose one or several parts of the getter layers 104 and 110 within the cavity 405, and thus to control the gas atmosphere of the cavity 405.

Figure 4C:
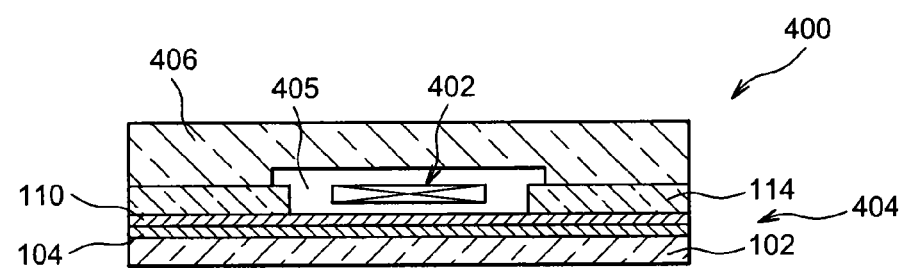

FIG. 4C shows another variant embodiment of the micro-device 400.

Unlike the micro-device shown in FIGS. 4A and 4B, the cover 406 and the substrate 404 are not bonded by a bonding bead. In FIG. 4C, the cover 406 is directly bonded in contact with the layer 114 of the substrate 402. Thus, when the cover 406 comprises a semiconductor such as silicon, this bonding may be done by SDB (Silicon Direct Bonding) between the cover 406 and the layer 114. When the cover 406 comprises glass, the cover 406 and the layer 114 may be bonded by anodic bonding.

Figure 4D:
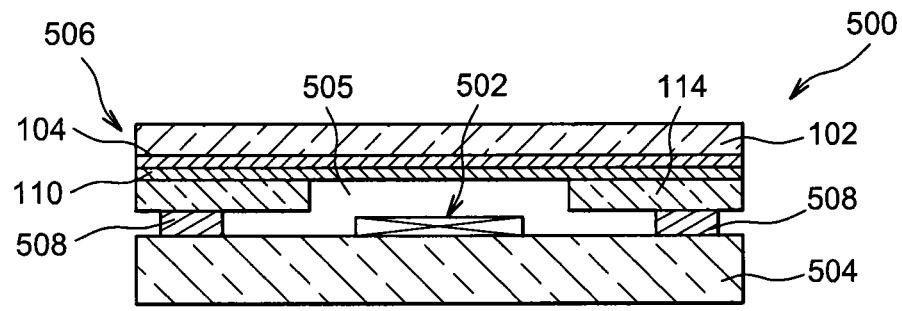

A micro-device 500 shown in FIG. 4D comprises a micro-system 502 formed on a substrate 504 comprising for example the semi-conductor. The micro-system 502 is encapsulated in a cavity 505 formed between the substrate 504 and a cover formed by a substrate 506 similar to the previously described substrate 100 and bonded to the substrate 504 by a bonding bead 508. Part of the layer 114 of the substrate 506 is etched to form part of the cavity 505, and to expose part of the getter layer 110. Thus, unlike the previously described micro-device 400, the substrate with buried getter layers is not used as support for making a micro-system but rather to form the cover of the cavity in which the micro-system is encapsulated.

Figure 4E:
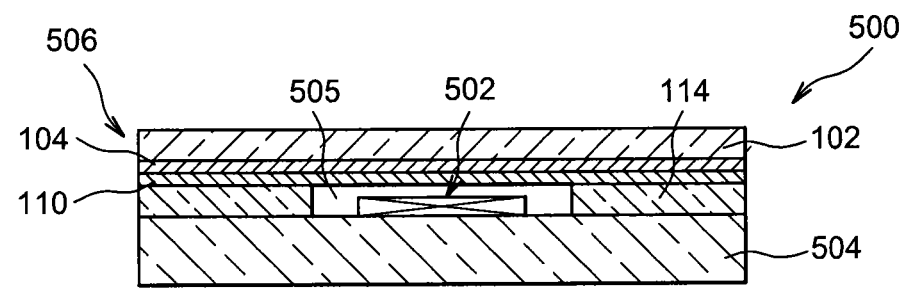

In one variant embodiment shown in FIG. 4E, the substrate 504 and the cover formed by the substrate 506 with buried getter layers are not bonded by a bonding bead, but instead a direct bond is made between the substrate 504 and the substrate 506 (for example by silicon direct bonding or anodic bonding). In this case, the etched part of the layer 114 forms the entire space in the cavity 505. Therefore in this case, the layer 114 should be made sufficiently thick so that a sufficiently high cavity 505 can be made to contain the micro-system 502.

Figure 4F:
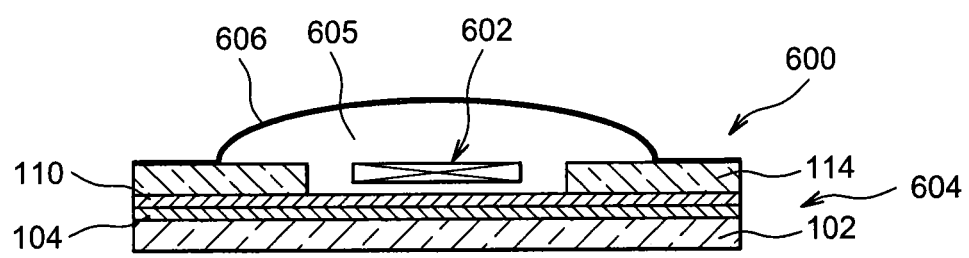
Figure 4G:
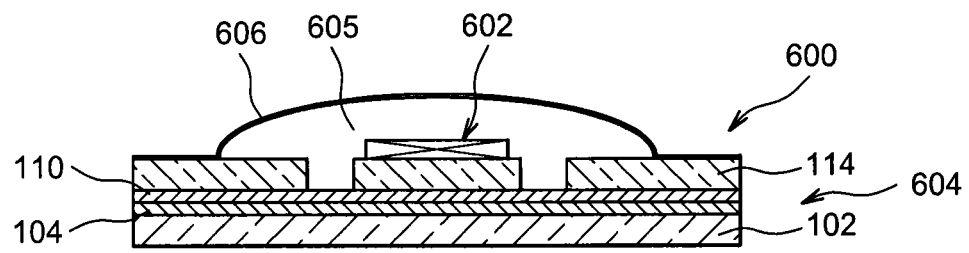

A micro-device 600 shown in FIGS. 4F and 4G comprises a micro-system 602 formed on a substrate 604 similar to the previously described substrate 100. Unlike the micro-device 400 shown in FIGS. 4A and 4B, the cover is not formed by a solid substrate bonded to the substrate 604 but rather by a thin layer 606 bonded to the layer 114 of the substrate 604. Such a cover may be formed by covering the micro-system 602 by a sacrificial layer that is shaped as a function of the required space for the cavity 605. The thin layer 606 is then deposited on the sacrificial material.

Finally, the sacrificial material is etched, for example through an opening formed in the cover 606, this opening subsequently being closed off.

Figure 4H:
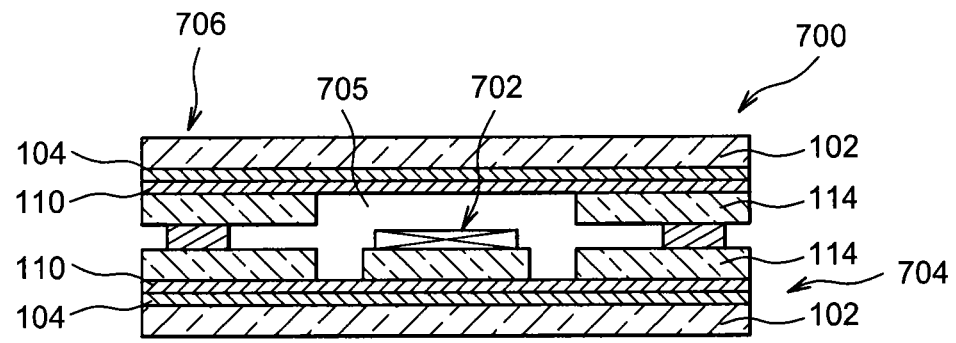

A micro-device 700 shown in FIG. 4H comprises a micro-system 702 encapsulated in a cavity 705 formed between two substrates 704 and 706 with buried getter layers, for example similar to the previously described substrate 100. Thus, the layers 114 of substrates 704 and 706 are etched to expose part of the layer 110 of these two substrates 704, 706. For example, the micro-system 702 is made in the layer 114 of the substrate 704.

Thus, the substrates with buried getter layers act both as support for producing a micro-system but also as the cover of the cavity 705 in which the micro-system 702 is encapsulated.

The invention claimed is:

1. A method for producing a substrate with buried layers of getter material, comprising:
   making a first stack comprising at least one layer of a first getter material, arranged over an entire surface of a face of a first support;
   making a second stack comprising at least one layer of a second getter material, arranged over an entire surface of a face of a second support; and
   bringing the first stack into contact with the second stack and bonding the layers of the first and second getter materials together such that the layers of the first and second getter materials are arranged between the first and second support.

2. The method according to claim 1, in which the bonding of the layers of the first and second getter materials together comprises a thermocompression at a temperature greater than or equal to a lowest temperature among thermal activation temperatures of the first and second getter materials.

3. The method according to claim 2, in which the first stack further comprises a protective layer of the first getter material arranged on the layer of the first getter material, and/or the second stack further comprises a protective layer of the second getter material, arranged on the layer of the second getter material, and the bringing the layers into contact and performing thermocompression makes the protective layers diffuse with the layers of getter material on which the protective layers are arranged.

4. The method according to claim 3, in which the protective layer of the first getter material and/or the protective layer of the second getter material comprise oxide and/or nitride.

5. The method according to claim 4, in which the protective layer of the first getter material and/or the protective layer of the second getter material are made by oxidation and/or nitridation of the layer of the first getter material and/or the layer of the second getter material under a dry atmosphere of dioxygen and/or dinitrogen.

6. The method according to claim 2, in which the contact and thermocompression between the first stack and the second stack is applied under a secondary vacuum.

7. The method according to claim 2, further comprising a thinning and/or polishing of the first support and/or the second support, after the contact and thermocompression.

8. The method according to claim 2, further comprising degassing faces of the stacks that are to be brought into contact with each other, after the first and the second stack have been produced and before the contact and thermocompression.

9. The method according to claim 1, in which the first stack further comprises a first dielectric layer and/or a bond layer comprising titanium and/or zirconium, arranged between the first support and the layer of the first getter material, and/or the second stack further comprises a second dielectric layer and/or a bond layer comprising titanium and/or zirconium arranged between the second support and the layer of the second getter material.

10. The method according to claim 1, in which the first and/or the second stack further comprises at least one copper and/or nickel and/or platinum and/or silver and/or ruthenium and/or chromium and/or gold and/or aluminium layer arranged between the first support and the layer of the first getter material and/or between the second support and the layer of the second getter material.

11. The method according to claim 1, further comprising a thinning and/or polishing of the layer of the first getter material and/or of the layer of the second getter material during the making of the first stack and/or the second stack, and/or when the first and/or second stack comprises the protective layer of the first getter material and/or the protective layer of the second getter material, hydrophilic treatment of the protective layer of the first getter material and/or the protective layer of the second getter material.

12. A method for making a device, comprising:
implementing a method to make a first substrate according to claim 1;
making a micro-system on the first substrate or on a second substrate;
etching part of the first substrate, exposing part of the layer of the first getter material and/or part of the layer of the second getter material; and
encapsulating the micro-system in a cavity formed between the first substrate and a cover bonded to the first substrate when the micro-system is made on the first substrate, or encapsulating the micro-system in a cavity formed between the second substrate and the first substrate bonded to the second substrate when the micro-system is made on the second substrate, the part of the layer of the first getter material and/or the part of the layer of the second getter material being arranged in the cavity.

13. The method according to claim 12, in which, the method for producing the first substrate comprises a thinning and/or polishing of the second support, and the micro-system is made in and/or on the second thinned and/or polished support.

14. The method according to claim 12, in which the cover comprises a thin layer of material.

15. The method according to claim 12, in which the cover comprises a substrate obtained by implementing a method for producing a substrate with buried layers of getter material.

16. A substrate with layers of buried getter material, comprising:
a first stack comprising at least one layer of a first getter material, arranged over an entire surface of a face of a first support;
a second stack comprising at least one layer of a second getter material arranged over an entire surface of a face of a second support; and
the layers of the first and the second getter material being bonded to each other and arranged between the first support and the second support, forming the buried layers of getter material between the first support and the second support.

17. The substrate according to claim 16, in which the layer of the first getter material and/or the layer of the second getter material further comprise dissolved particles of oxygen and/or nitrogen.

18. The substrate according to claim 16, in which the first support and/or the second support comprises at least one semiconductor.

19. The substrate according to claim 16, in which the first getter material and/or the second getter material comprise titanium and/or zirconium and/or vanadium and/or niobium and/or tantalum.

20. The substrate according to claim 16, in which the first stack further comprises a first dielectric layer and/or a bond layer comprising titanium and/or zirconium, arranged between the first support and the layer of the first getter material, and/or the second stack further comprises a second dielectric layer and/or a bond layer comprising titanium and/or zirconium arranged between the second support and the layer of the second getter material.

21. The substrate according to claim 16, in which the first and/or the second stack further comprises at least one copper and/or nickel and/or platinum and/or silver and/or ruthenium and/or chromium and/or gold and/or aluminium layer, arranged between the first support and the layer of the first getter material and/or the second support and the layer of the second getter material.

22. A device comprising at least one micro-system made on a first substrate according to claim 16 or on a second substrate and encapsulated, when the micro-system is made on the first substrate, in a cavity formed between the first substrate and a cover bonded to the first substrate or, when the micro-system is made on the second substrate, in a cavity formed between the second substrate and the first substrate bonded to the second substrate, exposed part of the layer of the first getter material and/or exposed part of the layer of the second getter material being arranged in the cavity.

23. The device according to claim 22, in which the cover comprises a thin layer of material or a substrate with buried layers of getter material.

* * * * *

UNITED STATES PATENT AND TRADEMARK OFFICE
CERTIFICATE OF CORRECTION

| | | |
|---|---|---|
| PATENT NO. | : 8,956,958 B2 | Page 1 of 1 |
| APPLICATION NO. | : 13/883480 | |
| DATED | : February 17, 2015 | |
| INVENTOR(S) | : Xavier Baillin | |

It is certified that error appears in the above-identified patent and that said Letters Patent is hereby corrected as shown below:

On the title page, Item (54) and in the Specification, Column 1, the Title should read:

-- METHOD FOR THE PRODUCTION OF A SUBSTRATE COMPRISING BURIED LAYERS OF GETTER MATERIAL --

Signed and Sealed this
Second Day of June, 2015

Michelle K. Lee
*Director of the United States Patent and Trademark Office*